United States Patent [19]

Aparin

[11] Patent Number: 5,942,929
[45] Date of Patent: Aug. 24, 1999

[54] ACTIVE PHASE SPLITTER

[75] Inventor: Vladimir Aparin, San Diego, Calif.

[73] Assignee: Qualcomm Incorporated, San Diego, Calif.

[21] Appl. No.: 08/862,094

[22] Filed: May 22, 1997

[51] Int. Cl.[6] .............................. H03K 5/00; H03K 5/13
[52] U.S. Cl. ...................... 327/233; 327/238; 327/254
[58] Field of Search .................................. 327/231, 232, 327/233, 235, 237–240, 246, 247, 250–259; 330/277

[56] References Cited

U.S. PATENT DOCUMENTS

| | | | |
|---|---|---|---|
| 4,806,888 | 2/1989 | Salvage et al. | 333/138 |
| 4,994,773 | 2/1991 | Chen et al. | 327/231 |
| 5,038,060 | 8/1991 | Francheteau et al. | 327/231 |
| 5,294,848 | 3/1994 | Kannegundla | 327/231 |
| 5,317,200 | 5/1994 | Nishiyama | 307/262 |
| 5,317,276 | 5/1994 | Yamamoto | 327/231 |
| 5,644,260 | 7/1997 | Dasilva et al. | 327/240 |

FOREIGN PATENT DOCUMENTS

| | | | |
|---|---|---|---|
| 0254072 | 6/1987 | European Pat. Off. | H03H 11/20 |
| 0519170 | 4/1992 | European Pat. Off. | H03H 11/22 |
| 9110286 | 7/1991 | WIPO | H03H 11/22 |

OTHER PUBLICATIONS

"Analysis and Design of Analog Integrated Circuits, Second Edition" by Paul Gray and Robert Mayer, *Frequency Response of Integrated Circuits*; pp. 444–446.

*Primary Examiner*—Tuan T. Lam
*Attorney, Agent, or Firm*—Russell B. Miller; Brian S. Edmonston

[57] ABSTRACT

An active phase splitter comprises two or more phase shift circuits. Each phase shift circuit comprises a number of active devices and capacitors. For a single-pole active phase splitter, within each phase shift circuit, two active devices are configured as a cascode amplifier. The first active device is configured as a common source amplifier and the second active device is configured as a common gate amplifier. A capacitor is connected across the gate and drain of the first active device to generates the necessary pole-zero pair for the phase shift circuit. The cascode configuration results in the desired transfer function and provides transconversion of voltage input to current outputs. Active phase splitters with two or more poles can be built using the same inventive concept.

15 Claims, 8 Drawing Sheets

PRIOR ART

FIG. 7 - PHASE DIFFERENCE VS. FREQUENCY

FIG. 8 - PHASE DIFFERENCE VS. FREQUENCY

ACTIVE PHASE SPLITTER

BACKGROUND OF THE INVENTION

I. Field of the Invention

The present invention relates to electronics circuits. More particularly, the present invention relates to a novel and improved phase splitter for generating multiple output signals of equal amplitude but different phases using active devices.

II. Description of the Related Art

Phase splitters are circuits which generate multiple output signals of equal amplitude but different phases. Phase splitters are widely used in the electronics industry for a variety of applications. In particular, phase splitters are commonly employed in communication applications. Typical applications include single sideband modulators, image-reject mixers, and IQ modulators and demodulators such as those used in quadrature phase shift keying (QPSK) or offset quadrature phase shift keying (OQPSK) modulation. These applications require a 90° phase splitter wherein two output signals of equal amplitude but delayed by a quarter period relative to each other (or 90° phase difference) are required. For phase splitters, it is the difference in the phases of the output signals, or the phase difference, which is of importance. The absolute phases of the output signals relative to the input signal is usually not important. For an ideal 90° phase splitter, the amplitude response and the phase difference response are flat across the all frequencies from DC to infinity ($\infty$) Hz.

Phase splitters can be implemented as a combination of all-pass networks. An all-pass network has a constant or flat amplitude response but the phase response varies over frequency. Two or more all-pass networks can be connected together to a common input, with each network having a different phase response. The outputs of the networks are signals having equal amplitude but different phases. Typically, the networks are selected such that the difference in the phases of the output signals equals a desired value at a specified frequency or frequency range.

Figure 1A:
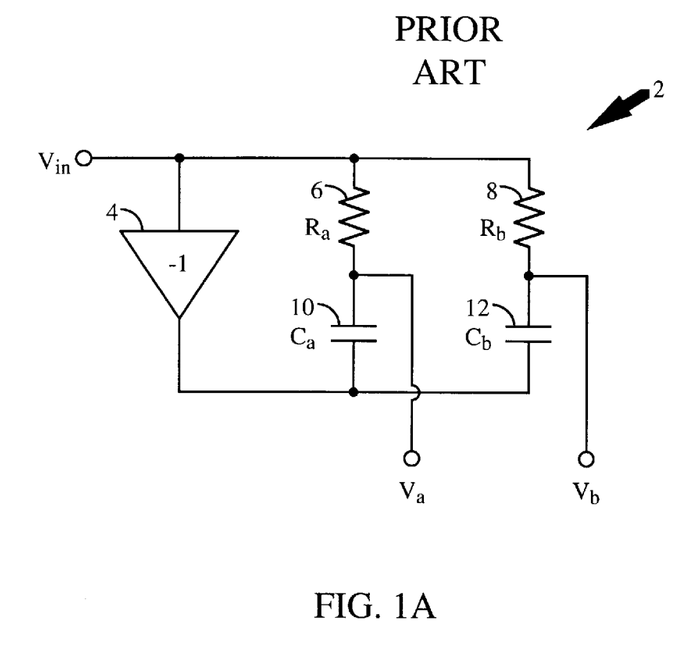
FIGS. 1A–1B are schematics diagrams of the passive phase splitter of the prior art without and with load resistors, respectively.
Figure 7:
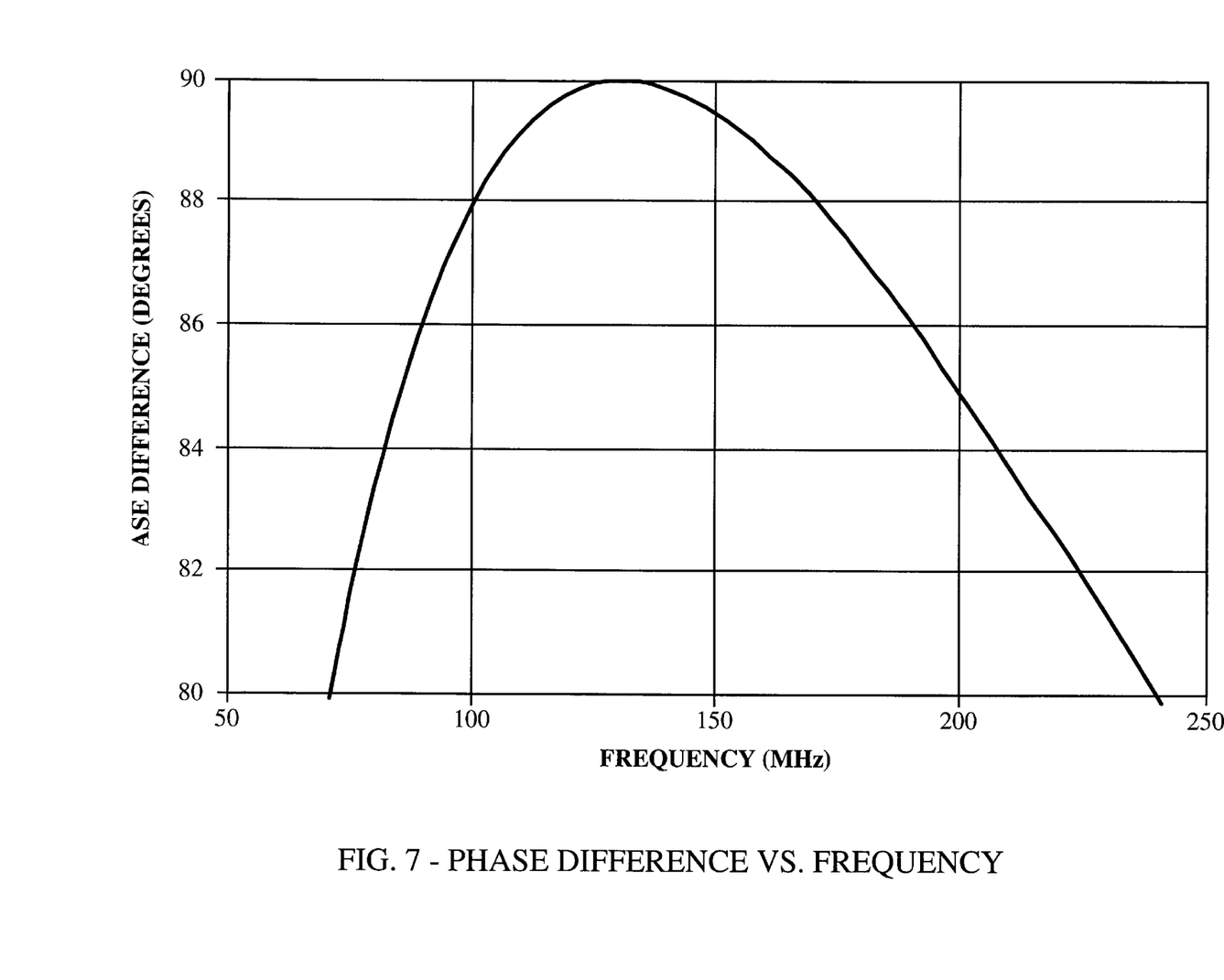
FIG. 7 is an exemplary phase difference response of a single-pole phase splitter centered about $\omega_o = 2\pi \cdot 130.8$ MHz.

A simple implementation of a passive phase splitter can be designed using single-pole RC all-pass networks as shown in FIG. 1A. Within passive phase splitter 2, amplifier 4 provides the inverting gain ($A_v=-1$) necessary for the operation of the feedback circuit. Resistor $R_a$ 6 and capacitor $C_a$ 10 provide a first phase shift of the input signal $V_{in}(s)$ and results in the output signal $V_a(s)$ at the node between resistor 6 and capacitor 10. Throughout the specification, the signals and transfer functions are described as functions of s where s is a complex frequency (s=j$\omega$). Similarly, resistor $R_b$ 8 and capacitor $C_b$ 12 provide a second phase shift of the input signal $V_{in}(s)$ and results in the output signal $V_b(s)$. The transfer functions of the output signals $V_a(s)/V_{in}(s)$ and $V_b(s)/V_{in}(s)$ have the same gain, thereby resulting in signals $V_a(s)$ and $V_b(s)$ having equal amplitude. However, the phases of $V_a(s)$ and $V_b(s)$ are different and the phase difference can be plotted versus frequency as shown in FIG. 7. The plot shows that at the center frequency $\omega_o=2\pi \cdot 130.8$ MHz, the phase difference between $V_a(s)$ and $V_b(s)$ is 90°.

Typically, the output signals $V_a(s)$ and $V_b(s)$ need to drive another circuit, which is also referred to as a load, in the system. If the impedance of the load is a resistance of finite value, the responses of passive phase splitter 2 will be altered. Passive phase splitter 2 needs to be modified to maintain an accurate balance of the amplitude and phase difference between the two output signals. One possible modification is the addition of resistors in series with $C_a$ and $C_b$ (not shown in FIG. 1A). Alternately, the output signals can be buffered before driving the load.

In the ideal form, without taking into account circuit parasitic effect which are inevitable in any circuit, the transfer function of passive phase splitter 2 results in the desired amplitude and phase difference responses. However, in practice, this circuit has several drawbacks. First, passive phase splitter 2 exhibits power loss due to the presence of resistors 6 and 8 in the circuit. The power loss is usually compensated by adding extra gain stages which increase complexity and power consumption of the system. Second, passive phase splitter 2 exhibits degradation in the noise figure due to the thermal noise in resistors 6 and 8. Third, the transfer functions of passive phase splitter 2 is sensitive to the impedance of the load. Sensitivity to the load impedance can result in degradation in the balance of the amplitude and phase difference. Furthermore, sensitivity to the variations in the load impedance from circuit to circuit can render it difficult to design passive phase splitter 2 for the worse case. And fourth, the phase difference between the outputs of passive phase splitter 2 at a particular frequency depends on the absolute values of resistors 6 and 8. The dependence of the absolute values on process and temperature variations causes variations in the phase difference. The present invention addresses these problems by the use of an active phase splitter.

SUMMARY OF THE INVENTION

The present invention is a novel and improved circuit for the generation of multiple signals having equal amplitude but different phases by the use of active devices. The active devices can be bipolar-junction transistors (BJT), heterojunction-bipolar-transistor (HBT), metal-oxidesemiconductor field effect transistors (MOSFET), gallium arsenide field effect transistors (GaAsFET), P-channel devices, or other active semiconductor devices. The active phase splitter of the present invention comprises two or more phase shift circuits. Each phase shift circuit comprises a number of active devices and at least one reactive component (e.g. capacitor). For a single-pole active phase splitter, within each phase shift circuit, two active devices are configured as a cascode amplifier. The first active device is configured as a common source amplifier and receives the input signal at the gate. The second active device is configured as a common gate amplifier and has its source connected to the drain of the first active device. A capacitor is connected across the gate and drain of the first active device to generate the necessary pole-zero pair for the phase shift circuit. The zero is generated by a combined action of the capacitor and the first active device and the pole is generated by a combined action of the capacitor and the second active device. The second active device also provides the voltage to current conversion to generate output signals in the current mode.

It is an object of the present invention to provide an active phase splitter using active devices and reactive components (e.g. capacitors) to obtain amplitude and phase difference responses which are balanced. The absence of resistors in the circuit improves the noise figure and power efficiency of the active phase splitter of the present invention over the passive phase splitter of the prior art.

It is another object of the present invention to provide an active phase splitter with a voltage to current conversion function. This function allows the use of the active phase splitter as a transconverter of an active circuit. Thus, no extra active devices are needed and the DC bias current is effectively reused by the active circuit with which the transconverter is associated.

It is yet another object of the present invention to provide an active phase splitter with a transfer function which is less sensitive to the load impedance. The active phase splitter utilizes active devices which are connected in the cascode configuration to isolate the input and internal nodes from the external loading.

It is yet another object of the present invention to provide for active phase splitters having two or more poles. More poles increase the operating frequency range of the active phase splitter.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Phase splitters can be implemented as a combination of all-pass networks. The transfer function of an all-pass network can be expressed in the general form as $$T(s) = A \cdot \frac{N_1(s)}{N_2(s)}, \quad (1)$$

where s is the complex frequency, A is the DC gain, and $N_1(s) = N_2(-s)$. The transfer function T(s) contains a number of poles on the left half plane of the s-plane and an equal number of zeros on the right half plane. For the all-pass structure, the zeros are symmetric to the poles about the jω (s=0) axis, resulting in a circuit gain of A across all frequencies.

Referring to the figures, an exemplary single-pole passive phase splitter of the prior art is shown in FIG. 1A. The transfer functions of the output signals $V_a(s)$ and $V_b(s)$ versus the input signal $V_{in}(s)$ for an infinite load impedance can be expressed as:

$$T_a(s) = \frac{1 - sR_aC_a}{1 + sR_aC_a} \text{ and } T_b(s) = \frac{1 - sR_bC_b}{1 + sR_bC_b}, \quad (2)$$

where $T_a(s) = V_a(s)/V_{in}(s)$ and $T_b(s) = V_b(s)/V_{in}(s)$. To obtain the 90° phase difference between $V_a(s)$ and $V_b(s)$ at the frequency $\omega_o$, the external components need to satisfy the following conditions:

$$R_aC_a = \frac{\sqrt{2} + 1}{\omega_a} \text{ and } R_bC_b = \frac{\sqrt{2} - 1}{\omega_a}. \quad (3)$$

When the conditions of equation (3) are satisfied, the difference between the phases of the output signals $V_a(s)$ and $V_b(s)$ (or phase difference) can be plotted versus frequency as shown in FIG. 7. In the ideal passive phase splitter, without taking into account the circuit parasitics, the amplitude of the output signals are equal.

Figure 1B:
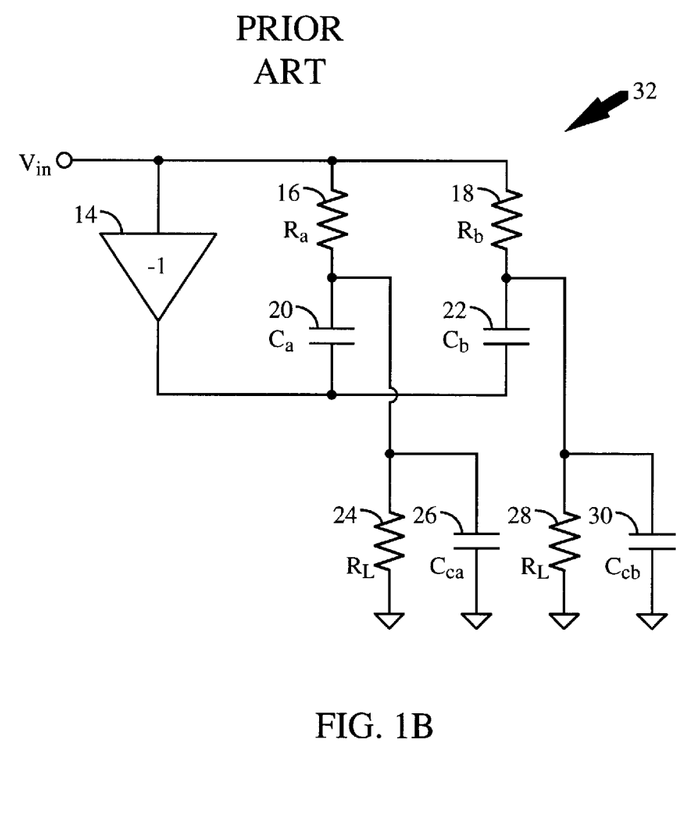

In practical cases, passive phase splitter 2 is loaded by some finite impedance. This load impedance changes the transfer function of passive phase splitter 2. To maintain an all-pass response, extra passive components are needed. For example, if the load impedance is purely resistive, the all-pass response can be achieved by adding shunt capacitors to the outputs of passive phase splitter 2. The modified passive phase splitter 32 loaded with resistive load $R_L$ 24 and 28 is shown in FIG. 1B. The transfer functions for passive phase splitter 32 can be expressed as:

$$T_a(s) = A_a \cdot \frac{1 - sR_aC_a}{1 + sR_a(C_a + C_{ca})A_a} \text{ and} \quad (4)$$

$$T_b(s) = A_b \cdot \frac{1 - sR_bC_b}{1 + sR_b(C_b + C_{cb})A_b},$$

where $A_a = R_L/R_L + R_a$ and $A_b = R_L/R_L + R_b$. For the transfer functions shown in equation (4) to be all-pass with equal amplitude responses, the following conditions need to be satisfied:

$$R_a = R_b = R, \; C_{ca} = C_a \frac{R}{R_L}, \text{ and } C_{cb} = C_b \frac{R}{R_L}. \quad (5)$$

Passive phase splitter 32 exhibits an amplitude loss of $R_L/R_L + R$. Also, variations in load resistance $R_L$ 24 and 28 change the amplitude and phase responses of the transfer functions. As a result, the magnitudes of $V_a(s)$ and $V_b(s)$ become unequal (amplitude imbalance) and their phase difference deviates from the desired value (phase imbalance).

The resistors used in the passive phase splitter also generate thermal noise which is added to the total noise generated in the load. This increase in noise power results in the degradation of the system noise performance.

I. Single-Pole Active Phase Splitter

Figure 2:
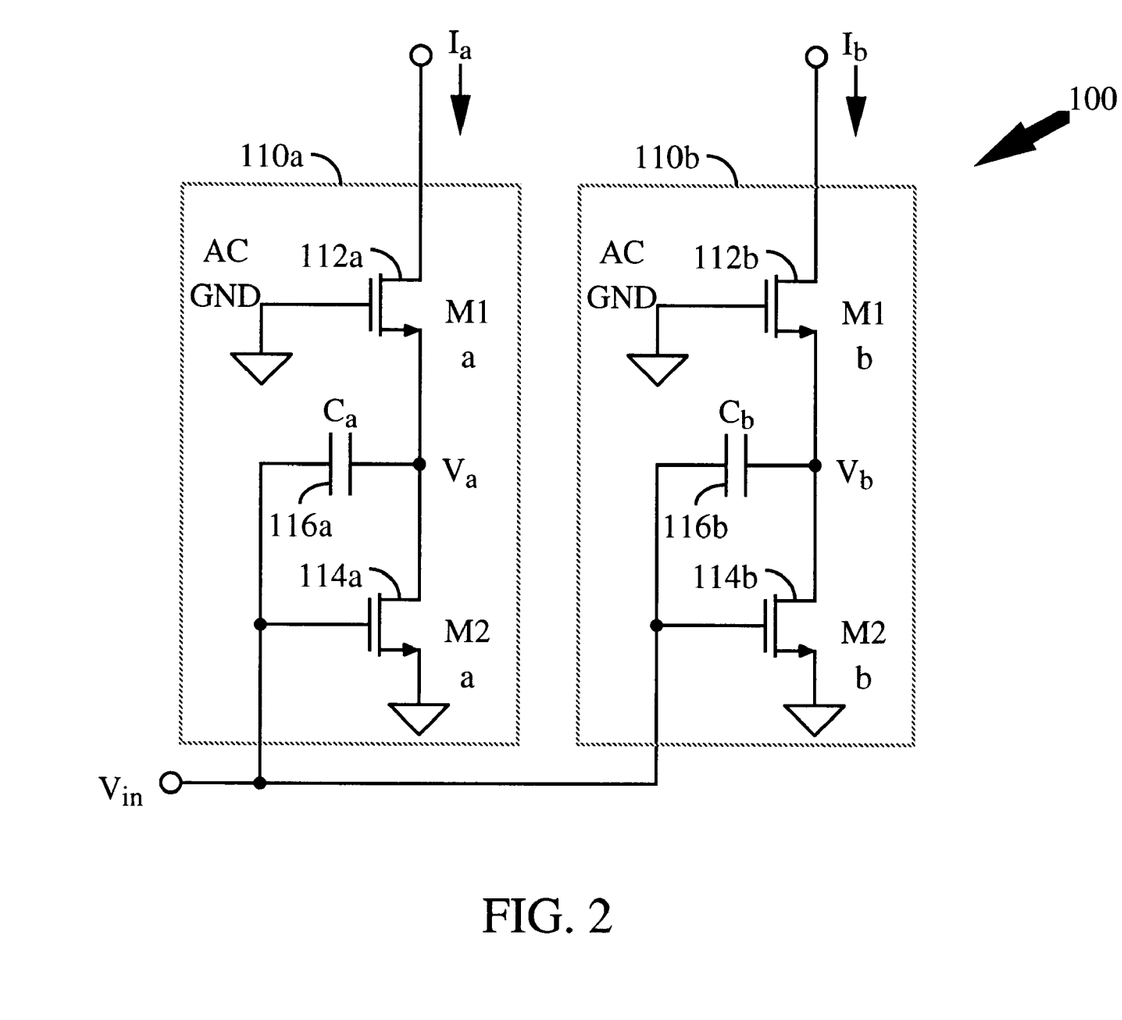
FIG. 2 is an exemplary schematics diagram of the single-pole active phase splitter of the present invention.

FIG. 2 illustrates an exemplary schematics diagram of a single-pole active phase splitter of the present invention. Active phase splitter 100 comprises two or more phase shift circuits 110. Each phase shift circuit 110 receives the input signal $V_{in}(s)$ and produces output signals $I_a(s)$ and $I_b(s)$ which are current mode signals. The components of phase shift circuits 110 are selected such that the amplitude of the output signals are equal but the difference in the phases of the output signals is a desired value at a specified frequency.

Within each phase shift circuit 110, a pair of active devices 112 and 114 and capacitor 116 produce the desired transfer function. In the exemplary embodiment, active devices 112a and 114a can be comprised of bipolar-junction transistors (BJT), heterojunction-bipolar-transistor (HBT), metal-oxide-semiconductor field effect transistors (MOSFET), gallium arsenide field effect transistors (GaAsFET), P-channel devices, or other active semiconductor devices. The present invention is described using MOSFETs and references are made to features inherent in MOSFETs, specifically the gate, source, and drain. For an implementation using BJTs, the gate, source, and drain of the MOSFETs are replaced with the base, emitter, and collector of the BJT, respectively.

The source of active device 112 is connected to the drain of active device 114. The gate of active device 112 is biased to a DC voltage and bypassed to ground through a bypass capacitor (not shown in FIG. 2). Thus, the gate of active device 112 is effectively connected to AC ground (or ground) for AC analysis. Capacitor 116 is connected across the gate and drain of active device 114. The source of active device 114 is connected to ground and the gate of active device 114 is connected to the input signal $V_{in}(s)$. Finally, the drain of active device 112 is the output of phase shift circuit 110. The circuit topology of each phase shift circuit 110 is identical and only the values of capacitor 116 and the transconductances of active devices 112 and 114 are different.

The transfer functions of phase shift circuits 110 from the input signal $V_{in}(s)$ to the current output signals $I_a(s)$ and $I_b(s)$ can be expressed as:

$$T_{ia}(s) = g_2 \cdot \frac{1 - \frac{sC_a}{g_2}}{1 + \frac{sC_a}{g_1}} \text{ and} \quad (6)$$

$$T_{ib}(s) = g_2 \cdot \frac{1 - \frac{sC_b}{g_2}}{1 + \frac{sC_b}{g_1}},$$

where $g_1$ is the transconductance of active device 112, $g_2$ is the transconductance of active device 114, $C_a$ is the capacitance of capacitor 116a, and $C_b$ is the capacitance of capacitor 116b. In the exemplary embodiment, the transconductance $g_1$ of active devices 112a and 112b are the same to simplify the calculation of equation (6) and the design of active phase splitter 100. Similarly, the transconductance $g_2$ of active devices 114a and 114b are the same. Maintaining identical transconductance for multiple active devices can be achieved by matching the geometry of the active devices and careful circuit layout in accordance with techniques which are well known in the art for integrated circuit design.

A simplified functional circuit description of active phase splitter 100 of the present invention is as follow. Within phase shift circuit 110a, active devices 112a and 114a are configured as a cascode amplifier. Active device 114a is configured as a common source amplifier. Capacitor 116a is connected across the gate and drain of active device 114a to generate the necessary pole-zero pair for phase shift circuit 110a at output $I_a(s)$. With just active device 114a and capacitor 116a, the pole is at DC and the zero is at $s=g_2/C_a$. Active device 112a is configured as a common gate amplifier and connects to the output or drain of active device 114a. With the addition of active device 112a, the pole is pushed to $S=-g_1/C_a$ without affecting the zero location, resulting in the desired transfer function.

Notice that the pole and zero are not symmetric about the $j\omega$ axis when transconductances $g_1 \neq g_2$. Therefore, the amplitude response at output $I_a(s)$ varies over frequency. An all-pass structure can be easily obtained by making the transconductance $g_1=g_2=g$. The all-pass structure eliminates the amplitude variation over frequency and makes the amplitude responses of outputs $I_a(s)$ and $I_b(s)$ equal. In the present invention, capacitors 116a and 116b are selected to obtain the desired phase difference (typically 90°) between the outputs $I_a(s)$ and $I_b(s)$ at a specified frequency. Active device 112a also isolates the input and internal nodes from the load and minimize the sensitivity of the transfer function to loading effects.

The transconductances $g_1$ of active devices 112 and $g_2$ of active device 114 need not be the same to achieve the desired phase difference at a specified frequency. However, maintaining $g_1=g_2$ provides the all-pass response similar to equation (2) and amplitude balance. Referring to equation (6), the 90° phase difference between the two output signals $I_a(s)$ and $I_b(s)$ is achieved at $\omega_o$ if the following conditions are satisfied:

$$\frac{C_a}{g} = \frac{\sqrt{2}+1}{\omega_o} \text{ and } \frac{C_b}{g} = \frac{\sqrt{2}-1}{\omega_o}. \quad (7)$$

If the conditions in equation (7) are satisfied, the phase difference response versus frequency for the single-pole active phase splitter 100 is identical to that shown in FIG. 7 for the passive phase splitter of the prior art. In the exemplary embodiment, to obtain the 90° phase difference between the output signals at the center frequency $\omega_o=2\pi \cdot 130.8$ MHz, the values for capacitor $C_a$ 116a is 9.05 pF, capacitor $C_b$ 116b is 1.55 pF, and transconductance $g_1=g_2=3.08\times10^{-3}$ mhos. These values are shown for illustrative purpose only. In theory, the 90° phase difference at the center frequency $\omega_o$ can be obtained by many combination of capacitance and transconductance values. The present invention is directed to the use of capacitance and transconductance values of all ranges.

If the outputs of active phase splitter 100 are connected to some loads with resistive input impedance $R_L$, the transfer functions of the voltages across the loads become:

$$T_a(s) = sR_L \cdot \frac{1 - \frac{sC_a}{g}}{1 + \frac{sC_a}{g}} \text{ and} \quad (8)$$

$$T_b(s) = gR_L \cdot \frac{1 - \frac{sC_b}{g}}{1 + \frac{sC_b}{g}},$$

As shown in equation (8), load impedance does not affect the amplitude and phase relationship between the output voltages. Furthermore, active phase splitter 100 exhibits some voltage gain if the transconductance g is selected to be greater than $1/R_L$.

The capability of active phase splitter 100 to convert input voltage to output currents allows it to be used as a transconverter of active circuits. Active phase splitter 100 can be used as part of any active circuits. In this case, no extra active devices are needed to implement the transconversion function. Thus, there is no degradation in the noise performance of the active circuit. Furthermore, since the DC bias current of active phase splitter 100 is reused by other building blocks of the active circuit, there is minimal increase in the total power consumption.

The phase difference between the outputs of active phase splitter 100 at the specified frequency depends on the absolute value of transconductance g. The transconductance is a function of process parameters, temperature, and the bias point of the active devices. The dependence on bias can be used to compensate process and temperature variations in g and, thus, in the phase difference between the outputs of active phase splitter 100. Techniques to design bias circuits that automatically adjust the bias point of the active devices to maintain a fixed transconductance are known in the art. An example is the PTAT bias circuits for BJTs.

Figure 3:
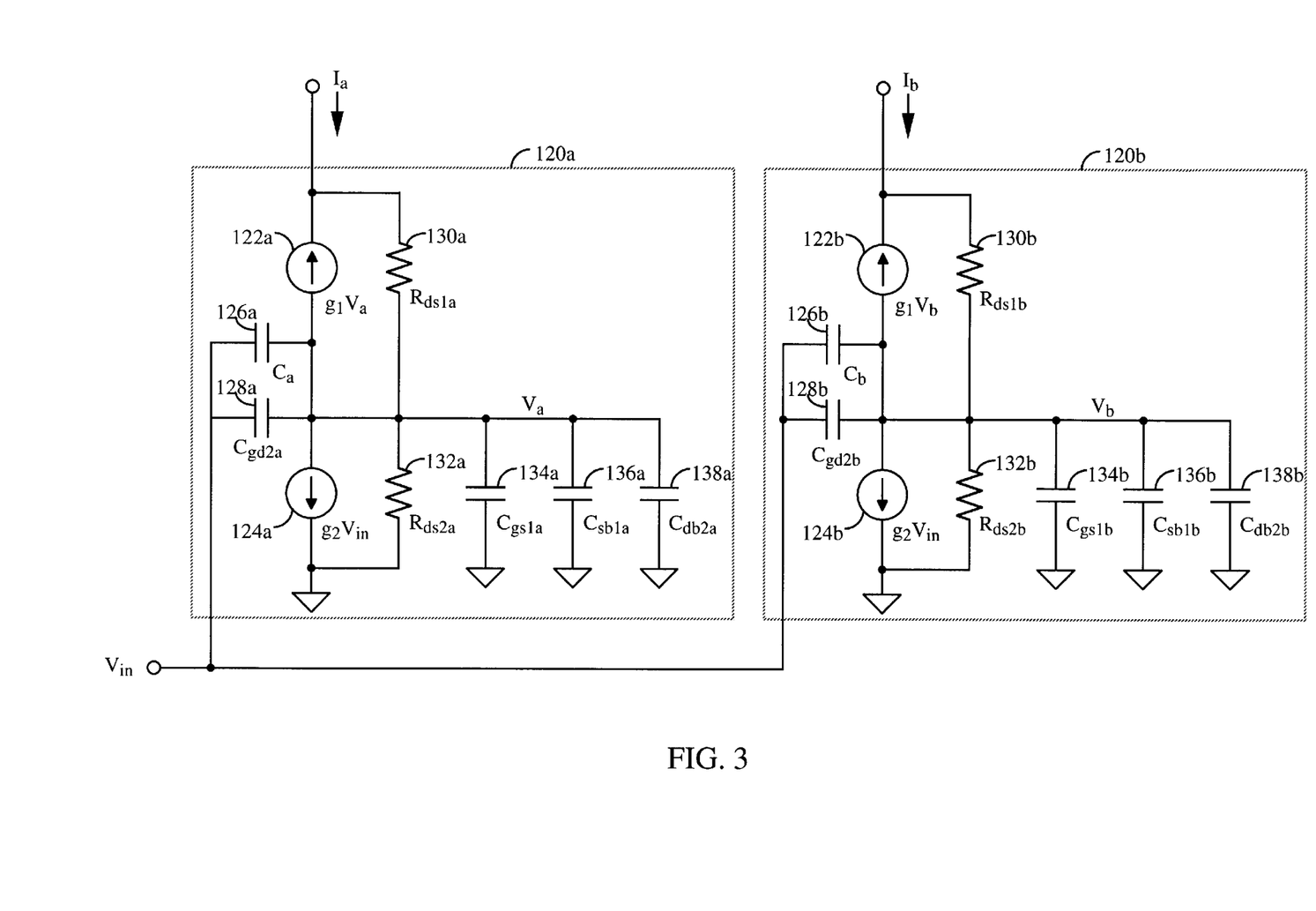
FIG. 3 is a schematics diagram of the small signal model of the single-pole active phase splitter showing the parasitic capacitances and output resistances of the active devices.

A simplified model of active phase splitter 100 is shown in FIG. 3. Within phase shift circuit 120a, active devices 112a and 112b are modeled with dependent current sources 122a and 122b having the transfer functions $I_a = g_1 \cdot V_a$ and $I_b = g_1 \cdot V_b$, respectively. Similarly, active devices 114a and 114b are modeled with dependent current sources 124a and 124b having the transfer functions $I_{a2} = g_2 \cdot V_{in}$ and $I_{b2} = g_2 \cdot V_{in}$, respectively. Capacitors 126 in FIG. 3 represent capacitors 116 in FIG. 2 and have the same values.

Equation (6) is calculated for an ideal active phase splitter without active device parasitics and circuit parasitics. However, the amplitude and phase difference balance of active phase splitter 100 is affected by the parasitic capacitances and the finite output resistances of active devices 112 and 114. The output resistance of active device 112 also introduces the dependence of the amplitude and phase balance on the load impedance. The parasitic capacitances of active devices 112 and 114 include the parasitic capacitance from the gate to the source of active device 112 which is modeled by capacitors $C_{gs}$ 134, parasitic capacitance from the source of active device 112 to the bulk or substrate of the circuit which is modeled by capacitors $C_{sb}$ 136, parasitic capacitance from the gate of active device 114 to its drain which is modeled by $C_{gd}$ 128, and parasitic capacitance from the drain of active device 114 to the bulk which is modeled by capacitors $C_{db}$ 138. Since the gate of active device 112 is at AC ground, one terminal of capacitor $C_{gs}$ 134 is connected to ground for AC analysis. The bulk or substrate of the circuit can also be represented as ground.

Output resistance $R_{ds}$ of active devices 112 and 114 are represented by resistors 130 for active devices 112 and resistors 132 for active devices 114. It can be shown that the dependence of the amplitude and phase balance on the load impedance can be neglected if the load impedance is much smaller than output impedance 130 of active device 112.

Figure 4:
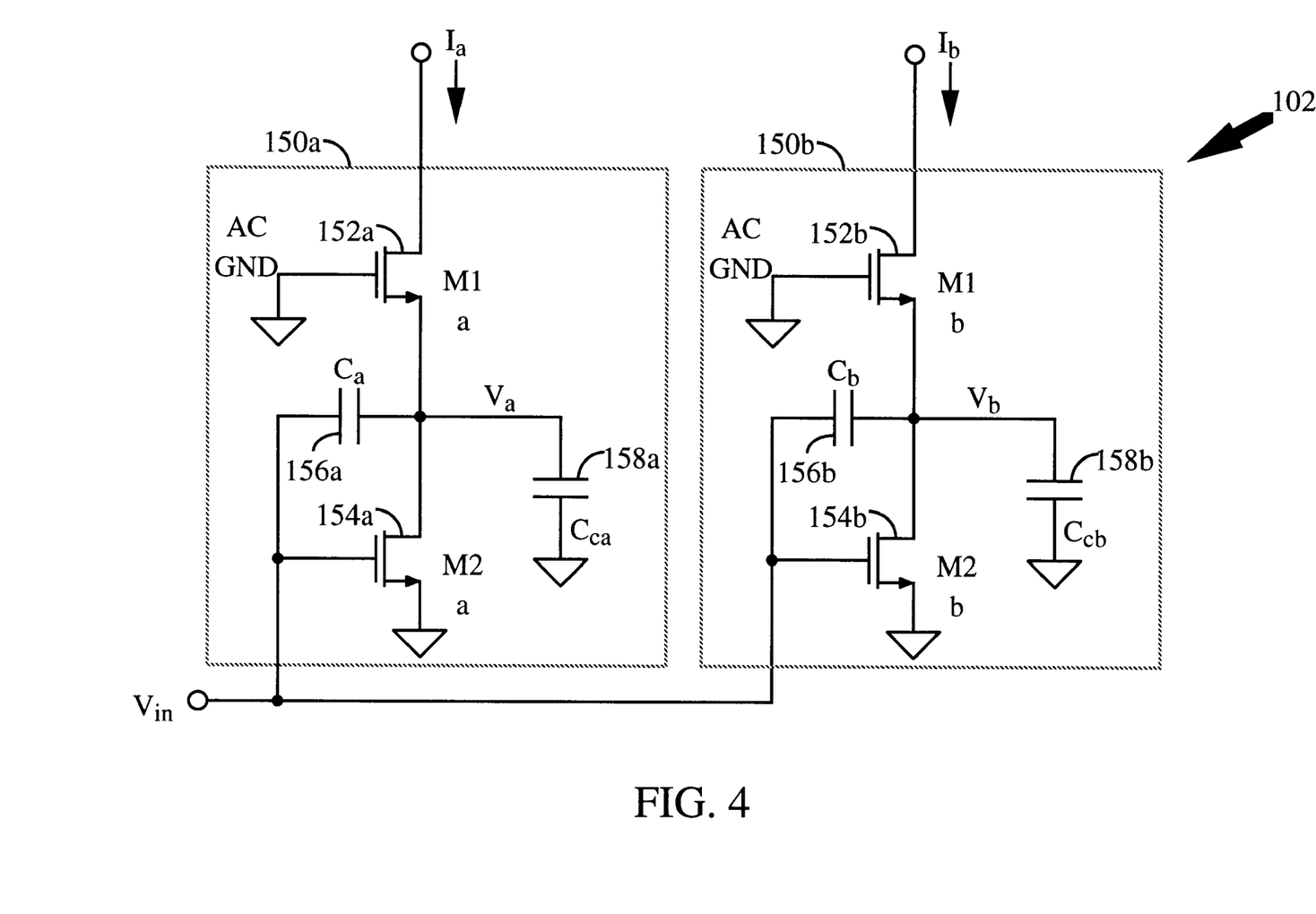
FIG. 4 is an exemplary schematics diagram of the compensated single-pole active phase splitter.

The effect of output resistance of active devices 112 and 114 on the amplitude and phase balance can be compensated. The schematics diagram of the compensated single-pole active phase splitter 100 is shown in FIG. 4. Compensated active phase splitter 102 of FIG. 4 is identical to active phase splitter 100 of FIG. 2 with the exception of compensation capacitors 158 which are added to the circuit in FIG. 4 to minimize the amplitude and phase imbalances caused by the output resistance $R_{ds}$ of the active devices. Capacitor $C_{ca}$ 158a is connected between the drain of active device 154a and ground. Similarly, capacitor $C_{cb}$ 158b is connected between the drain of active device 154b and ground. To minimize the amplitude and phase imbalances, capacitors $C_{ca}$ 158a and $C_{cb}$ 158b are selected such that the following conditions are satisfied:

$$\frac{g_1}{g_2} + \frac{1}{g_2 R_{ds1}} + \frac{1}{g_2 R_{ds2}} = 1 + \frac{C_{ca} + C_p}{C_a + C_{gd2a}} \text{ and} \quad (9)$$

-continued $$\frac{g_1}{g_2} + \frac{1}{g_2 R_{ds1}} + \frac{1}{g_2 R_{ds2}} = 1 + \frac{C_{cb} + C_p}{C_b + C_{gd2b}},$$

where $C_p$ is the total parasitic capacitance at the output nodes $V_a$ and $V_b$ which can be expressed as $C_p = C_{gs1} + C_{sb1} + C_{db2}$ (see FIG. 3).

In the present invention, it is preferable to balance the outputs of the active phase splitter. In some applications, amplitude balance is not as critical. For example, amplitude balance may not be as important if the output signals are used for driving switches or mixers. For these applications, amplitude imbalance as much as 5 percent, or more, may be acceptable. Therefore, the terms amplitude balance and equal amplitude as used in the present invention refer to the amount of amplitude balance necessary for the application for which the active phase splitter is used.

Although not an important consideration in the small signal model and AC analysis, the active devices within active phase splitter 102 need to be biased to the proper DC voltages to operate properly. The optimal DC bias point depends on the type of the active devices, the manufacturing process, the frequency of operation, the desired dynamic range, and other factors which are commonly considered by those skilled in the art. Furthermore, special biasing techniques which are known in the art can be employed to bias the active devices to provide performance which is independent of temperature. For example, for an implementation of the active phase splitter using bipolar transistors, the transistors can be biased using proportional to absolute temperature (PTAT) bias circuits. The PTAT circuits provide a constant (or fixed) transconductance over temperature and the fixed transconductance makes the transfer function of the active phase splitter insensitive to temperature.

The active phase splitter of the present invention is typically used in conjunction with other application circuits. For example, the active phase splitter can be combined with a Gilbert cell multiplier to form a single sideband modulator. In many applications, the active phase splitter can be integrated into the application circuit to save power consumption and circuit die area. The bias circuits of the application circuit can be shared with the active phase splitter. Furthermore, $I_a(s)$ and $I_b(s)$ of the active phase splitter can be connected to the high impedance nodes of the application circuit to form a gain stage.

As stated above, active phase splitter 102 as shown in FIG. 4 can be implemented with other types of active devices than the MOSFETs shown in FIG. 4. For example, active phase splitter 102 can be implemented using BJT transistors. For a BJT transistor, the transconductance $g_m$ of the transistor can be selected and calculated as $g_m = I_C/V_T$, where $I_C$ is the collector current and $V_T$ is the thermal voltage which can be approximated as 26 mV at room temperature (27° C.). The active devices may contain single or multiple transistors, such as Darlington transistors or cascode transistors. The active devices may also contain passive components, such as resistors in degenerated transistors.

II. Two-Pole Phase Splitter

The concept of the active phase splitter of the present invention can be extended to build active phase splitters with two or more poles. More poles improve the frequency response of the phase difference between the output signals and allow the active phase splitter to operate over a wider frequency range.

Figure 5:
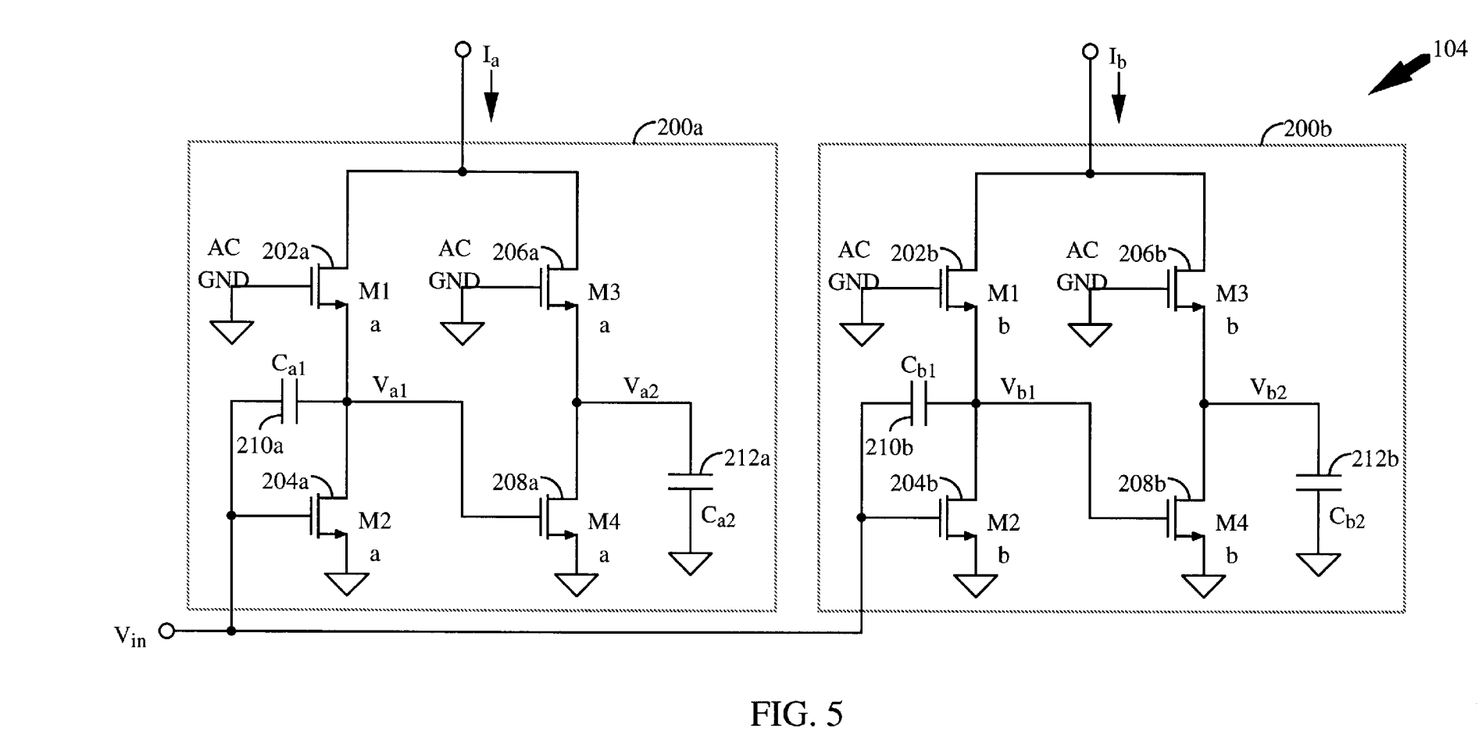
FIG. 5 is an exemplary schematics diagram of the two-pole active phase splitter.

The schematics diagram of an exemplary two-pole active phase splitter is shown in FIG. 5. Active phase splitter 104 is composed of two phase shift circuits 200a and 200b. Each phase shift circuit 200 receives the input signal and produces an output signal, similar to single-pole active phase splitter 102 in FIG. 4. Again, the components of phase shift circuits 200 are selected such that the amplitude of the output signals are equal but the difference in the phases of the output signals is at a desired value at a specified frequency.

Within each phase shift circuit 200, four active devices 202, 204, 206 and 208 and two capacitors 210 and 212 produce the desired transfer function. The source of active device 202 is connected to the drain of active device 204. Similarly, the source of active device 206 is connected to the drain of active device 208. The gates of active devices 202 and 206 are biased to DC voltages and bypassed to ground through bypass capacitors (not shown in FIG. 5). Thus, the gates of active devices 202 and 206 are effectively connected to AC ground (or ground) for AC analysis. The sources of active devices 204 and 208 are connected to ground. Capacitor 210 is connected across the gate and drain of active device 204 and capacitor 212 is connected to the drain of active device 208 and ground. The gate of active device 204 is connected to the input signal $V_{in}(s)$. The gate of active device 208 is connected to the drain of active device 204. Finally, the drains of active devices 202 and 206 are connected and comprise the output of phase shift circuit 200. The circuit topology of each phase shift circuit 200 is identical and only the values of capacitors 210 and 212 and the transconductances of active devices 202, 204, 206 and 208 are different.

To simplify the calculation of the transfer function, the transconductances of all active devices can be set to g. This restriction results in the second order all-pass networks with the following transfer functions:

$$T_{ia}(s) = -g \frac{s^2 - \frac{\omega_{0a}}{Q_{0a}} + \omega_{0a}^2}{s^2 + \frac{\omega_{0a}}{Q_{0a}} + \omega_{0a}^2} \text{ and} \quad (10)$$

$$T_{ib}(s) = -g \frac{s^2 - \frac{\omega_{0b}}{Q_{0b}} + \omega_{0b}^2}{s^2 + \frac{\omega_{0b}}{Q_{0b}} + \omega_{0b}^2},$$

where $$\omega_{0a} = \frac{\sqrt{2} g}{\sqrt{C_{a1} C_{a2}}} \omega_{0b} = \frac{\sqrt{2} g}{\sqrt{C_{b1} C_{b2}}} \quad (11)$$

$$Q_{0a} = \frac{1}{\sqrt{\frac{C_{a2}}{2C_{a1}}} + \sqrt{\frac{2C_{a1}}{C_{a2}}}} Q_{0b} = \frac{1}{\sqrt{\frac{C_{b2}}{2C_{b1}}} + \sqrt{\frac{2C_{b1}}{C_{b2}}}}$$

Figure 8:
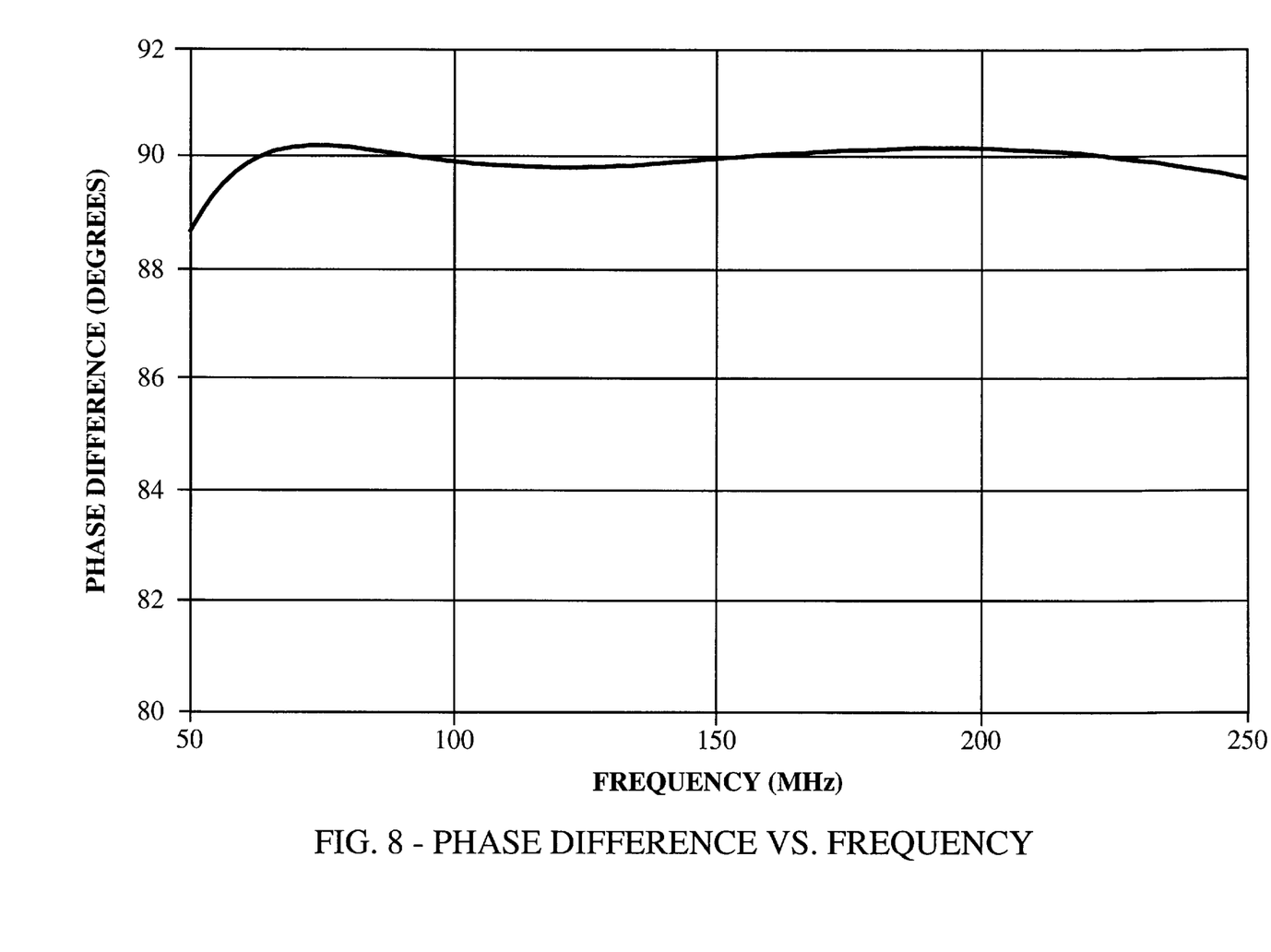
FIG. 8 is an exemplary phase difference response of a two-pole active phase splitter centered about $\omega_o = 2\pi \cdot 120$ MHz.

The transfer functions of phase shift circuits 200 are expressed in the form of output currents over the input voltage. Thus, $T_{ia}(s)=I_a(s)/V_{in}(s)$ and $T_{ib}(s)=I_b(s)/V_{in}(s)$. An exemplary response of the phase difference between the output signals $I_a(s)$ and $I_b(s)$ versus frequency for the case of $Q_{0a}=Q_{0b}=0.304$, $\omega_{oa}=2\pi \cdot 120 \times 10^6/1.891$ and $\omega_{ob}=2\pi \cdot 120 \times 10^6 \cdot 1.891$ is shown in FIG. 8.

The major advantage of two-pole active phase splitter 104 is a noticeably wider bandwidth than that of single-pole active phase splitter 102. This can be observed by comparing the phase difference response shown in FIG. 8 to the response shown in FIG. 7. However, two-pole active phase splitter 104 has one disadvantage in that it is less power efficient than single-pole active phase splitter 102. Referring to equation (10), notice that the gain at DC is equal to -g for two-pole active phase splitter 104. From equation (6), the DC gains is $g_2$ or g for single-pole active phase splitter 102. Each phase shift circuit 200 within two-pole active phase splitter 104 contains two current paths, one through active device 202 and one through active device 206. In contrast, each phase shift circuit 150 within single-pole active phase splitter 102 contains one current paths through active device 152 (see FIG. 4). Thus, each phase shift circuit 200 within two-pole active phase splitter 104 draws more current than each phase shift circuit 150 within single-pole active phase splitter 102.

Although not specifically discussed in the present invention, it would be obvious for those skilled in the art to extend the concept of the present invention to active phase splitters having three or more poles. Therefore, active phase splitters having three or more poles are within the scope of the present invention.

III. Exemplary Application Circuit

Although the active phase splitters in the present invention are illustrated as single ended circuits, improved performance may be obtained by implementing the active phase splitters with differential circuits. For example, input active devices 154a and 154b (see FIG. 4) which are configured as common source amplifiers can be replaced with differential amplifiers which are well known in the art. The inputs to the differential amplifiers are connected to the differential input signal or, if the input is single-ended, one input to the differential amplifiers can be connected to the single-ended input signal and the other input to the differential amplifiers can be AC grounded.

Figure 6:
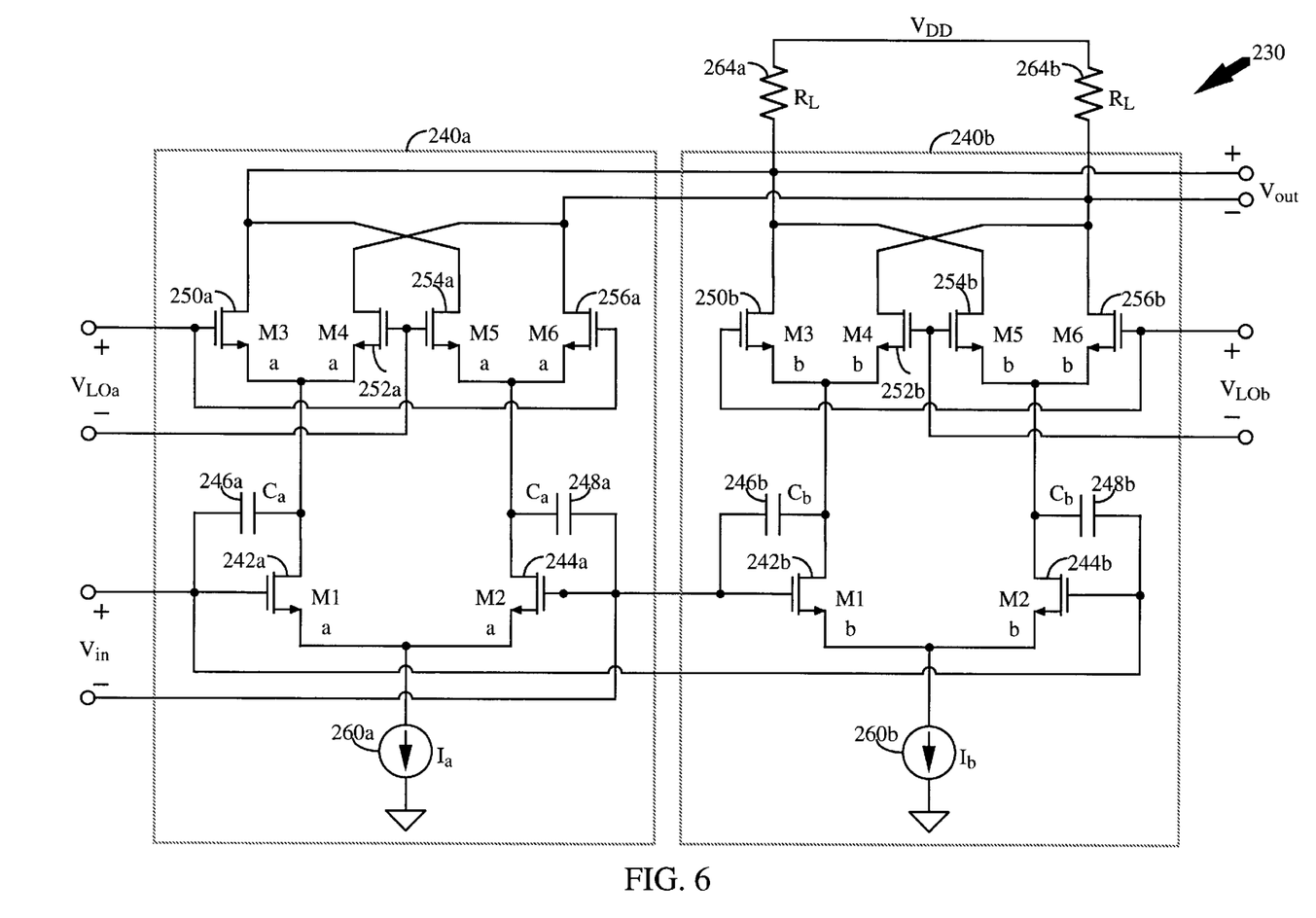
FIG. 6 is a schematics diagram of an exemplary application circuit utilizing the active phase splitter of the present invention.

An exemplary application circuit utilizing an active phase splitter implemented using differential pairs of MOSFETs is shown in FIG. 6. Active circuit 230 is a single-sideband modulator comprising two phase shifting circuits 240 and two load resistors 264. Within each phase shifting circuit 240, active devices 242 and 244 are connected in a common-source configuration and biased by current source 260. Active devices 242 and 244 comprise a differential pair driven by input signal $V_{in}(s)$. Active devices 250 and 252 as well as active devices 254 and 256 are connected in common-gate configuration and also comprise differential pairs. Capacitors 246 and 248 connected between the gate and drain of active devices 242 and 244, respectively, generate the pole-zero pair of the all-pass response of the active phase splitter.

If the gate bias voltages of active devices 250, 252, 254, and 256 change with a local oscillator (LO) frequency, phase shifting circuits 240a and 240b act as four quadrant multipliers. Furthermore, if the LO signals $V_{LOa}$ and $V_{LOb}$ are 90° apart and the outputs of phase shifting circuits 240a and 240b are cross-coupled as shown in FIG. 6, active circuit 230 acts a single-sideband modulator.

This application also illustrates how an active phase splitter can be used as a building block of an active circuit which, in this exemplary application, is a single-sideband modulator. The active phase splitter can also be used in LO buffers to generate LO drive signals which are 90° apart. Such LO buffers are used in the single-sideband modulators, IQ modulators and demodulators, and image-reject mixers. The active phase splitter can also be used in other applications that are known by those skilled in the art and are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A circuit for providing output signals having equal amplitude but different phases comprising:

a first phase shift circuit having a first input and producing a first output;

a second phase shift circuit having a second input and producing a second output;

wherein said first input and said second input are connected to an input signal and wherein said first output and said second output have substantially equal amplitude but different phases, and wherein each of said phase shift circuits include a first active device having a first gate, a first source, and a first drain, said first active device configured as a common source amplifier, said first source connected to a ground, said first gate receiving said input signal;

a capacitor connect across said first gate and said first drain; and a second active device having a second gate, a second source, and a second drain, said second active device configured as a common gate amplifier, said second gate connected to said ground, said second source connected to said first drain, said second drain comprising said output of said phase shift circuit.

2. The circuit of claim 1 wherein said first and second active devices of said first and second phase shift circuit are selected from the group consisting of bipolar junction transistors, heterojunction-bipolar-transistor, MOSFETs, GaAsFETs, and P-channel devices.

3. The circuit of claim 1 wherein each of said active devices of said first and second phase shift circuits has a transconductance, and wherein said capacitors and said transconductances of said first and second phase shift circuits are selected for a phase difference between said first output and said second output of 90 degree at a specified frequency.

4. The circuit of claim 1 wherein each of said phase shift circuits further comprises:

a compensation capacitor connected across said first drain and said ground;

wherein said compensation capacitors are selected to obtain a balance in amplitude between said first output and said second output.

5. The circuit of claim 1 wherein each of said active devices of said first and second phase shift circuits has a transconductance, said transconductances of said first active devices for all phase shift circuits are identical, and said transconductances of said second active devices for all phase shift circuits are identical.

6. The circuit of claim 5 wherein said transconductances of all active devices of said first and second phase shift circuit are identical.

7. The circuit of claim 1 wherein said first active device and said second active device of said first and second phase shift circuits are biased to provide performance which is independent of temperature.

8. A circuit for providing output signals having equal amplitude but different phases comprising a plurality of phase shift circuits, each phase shift circuit comprising:

a cascode amplifier having an input and an output, said cascode amplifier comprising a first amplifier and a second amplifier, said second amplifier connected to said first amplifier; and a capacitor connected between a junction of said first and second amplifier and said input, wherein said input of each said cascode amplifier of said plurality of phase shift circuits are connected to an input signal, and wherein said outputs of said cascode amplifiers of said plurality of said shift circuits have equal amplitude but different phases.

9. The circuit of claim 8 wherein each of said phase shift circuits further comprises:

a compensation capacitor connected to said first amplifier and ground; wherein said compensation capacitors are selected to obtain a balance in amplitude between said outputs of said cascode amplifiers of said plurality of said phase shift circuits.

10. The circuit of claim 8 wherein each of said first amplifiers and each of said second amplifiers has a transconductance, and wherein said transconductances of all first amplifiers are identical and said transconductances of all second amplifiers are identical.

11. The circuit of claim 10 wherein said transconductances of all first amplifiers and all second amplifiers are identical.

12. A circuit for providing output signals having equal amplitude but different phases comprising a plurality of phase shift circuits, each phase shift circuit receiving a common input signal, each phase shift circuit comprising:

a first active device having a first gate, a first source, and a first drain, said first active device configured as a common source amplifier, said first source connected to a ground, said first gate receiving said common input signal;

a first capacitor connected between said first gate and said first drain of said first active device;

a second active device having a second gate, a second source, and a second drain, said second active device configured as a common source amplifier, said second source connected to a ground, said second gate connected to said first drain;

a second capacitor connected between said second drain and said ground;

a third active device having a third gate, a third source, and a third drain, said third active device configured as a common gate amplifier, said third gate connected to said ground, said third source connected to said first drain; and a fourth active device having a fourth gate, a fourth source, and a fourth drain, said fourth active device configured as a common gate amplifier, said fourth gate connected to said ground, said fourth source connected to said second drain, said fourth drain connected to said third drain and comprising said output of said phase shift circuit.

13. The circuit of claim 12 wherein said first and second active devices of said plurality of said phase shift circuits are selected from the group consisting of bipolar junction transistors, heterojunction-bipolar-transistor, MOSFETs, GaAsFETs, and P-channel devices.

14. The circuit of claim 12, wherein said plurality of said phase shift circuits comprising two phase shift circuits, wherein each of said first and second active devices of each phase shift circuits has a transconductance, and wherein said capacitors and said transconductances of said each phase shift circuits are selected for a phase difference between said outputs of said phase shift circuits of 90 degree at a specified frequency.

15. The circuit of claim 12 wherein each of said first and second active devices of said plurality of phase shift circuits has a transconductance, and wherein said transconductances of all active devices of said plurality of phase shift circuits are identical.

* * * * *